(12) United States Patent
De Mey et al.

(10) Patent No.: US 7,979,045 B2
(45) Date of Patent: Jul. 12, 2011

(54) GNSS RECEIVER PACKAGE

(75) Inventors: Eric De Mey, Aeugst am Albis (CH); Andreas Thiel, Wilen b. Wollerau (CH)

(73) Assignee: U-Blox AG, Thalwil (CH)

( * ) Notice: Subject to any disclaimer, the term of this patent is extended or adjusted under 35 U.S.C. 154(b) by 1276 days.

(21) Appl. No.: 11/546,957

(22) Filed: Oct. 13, 2006

(65) Prior Publication Data

US 2008/0063123 A1    Mar. 13, 2008

(30) Foreign Application Priority Data

Sep. 12, 2006   (EP) ...................................... 06405389

(51) Int. Cl.
*H04B 1/10* (2006.01)
(52) U.S. Cl. ....................................... 455/301; 455/283
(58) Field of Classification Search .................. 455/280, 455/283, 300, 301, 310, 334, 323
See application file for complete search history.

(56) References Cited

U.S. PATENT DOCUMENTS

| | | | |
|---|---|---|---|
| 6,512,803 | B2 | 1/2003 | Heinzl et al. |
| 7,084,487 | B1 | 8/2006 | Conn |
| 2005/0259186 | A1 | 11/2005 | Mehr et al. |

OTHER PUBLICATIONS

Haddrell et al., "The Enemy Inside," GPS World, GPS Jammed by Room, Host, Self, www.gpsworld.com/wireless/indoor-positioning/the-enemy-inside-949?print=1, 8 pages, Mar. 1, 2005.

*Primary Examiner* — Christian A Hannon
(74) *Attorney, Agent, or Firm* — Oliff & Berridge, PLC

(57) ABSTRACT

An analog die (3) and a digital die (4) are supported by a plate (1) consisting of an electrically conductive material. Pads (5) of the dies (3, 4) are connected to each other, to plate (1) or to pins (2) surrounding the latter by bond wires (6). The upper side of the plate (1) is covered by a plastic mold (7) encapsulating the dies (3, 4), the bond wires (6) and, in part, the pins (2). For the suppression of external jamming signals as well as internal ones picked up by bond wires the digital die (4) comprises an adjustable notch filter which suppresses narrow frequency bands where jamming signals have been detected.

8 Claims, 2 Drawing Sheets

GNSS RECEIVER PACKAGE

FIELD OF THE INVENTION

The invention concerns a GNSS (Global Navigation Satellite System) receiver package according to the generic clause of claim 1. Packages of this type are used in GNSS receivers for vehicles, aeroplanes etc. as well as hand-held navigation devices for determining the position of the user based on the processing of signals emitted by satellites, e.g., GPS satellites.

PRIOR ART

A prior art GNSS receiver package usually comprises a plurality of integrated circuits, i.e., packaged dies on a substrate which is, together with other components, mounted on a printed circuit board of a GNSS receiver. The substrate is a support which serves as a mechanical base and at the same time contains the necessary electrical connections, in particular, balls or pins for outside connections and tracks connecting pads of the ICs to the same and among each other. It comprises several connection layers, each with a plurality of tracks consisting of electrically conductive material like copper and connecting pairs or groups of IC pads and/or package pins or balls. The connection layers are insulated from each other by intermediate insulation layers which often contain grounded shielding layers consisting of electrically conductive material sandwiched between insulating layers for preventing interferences between the connection layers. Otherwise there would be a considerable risk that interferences compromise the proper functioning of the package. Such substrates are, however, quite complex and expensive and contribute substantially to the overall cost of the package.

SUMMARY OF THE INVENTION

It is an object of the invention to provide a GNSS receiver package which is simpler, easier to produce and cheaper than known packages of the generic type. This object is attained using the features in the characterizing part of claim 1.

In a GNSS receiver package according to the invention bare dies are mounted on a plate made from an electrically conducting material surrounded by pins for establishing electrical connections to the outside with electrical connections within the package mostly or exclusively established via bond wires. Standardized packages of this type where the plate and dies are covered by a plastic mold are known, e.g., as QFP and QFN packages. The plates are known as leadframes.

Electrical interferences are not prevented by special measures concerning the electrical connections within the package but are suppressed by a notch filter which is at the same time used for the suppression of external jamming signals contained in the analog input signal. This is usually sufficient for ensuring proper functioning of the package and causes only negligible extra costs.

BRIEF DESCRIPTION OF THE DRAWINGS

In the following, the invention will be explained in more detail with reference to the following figures which show only embodiments.

DESCRIPTION OF THE PREFERRED EMBODIMENTS

Figure 1:
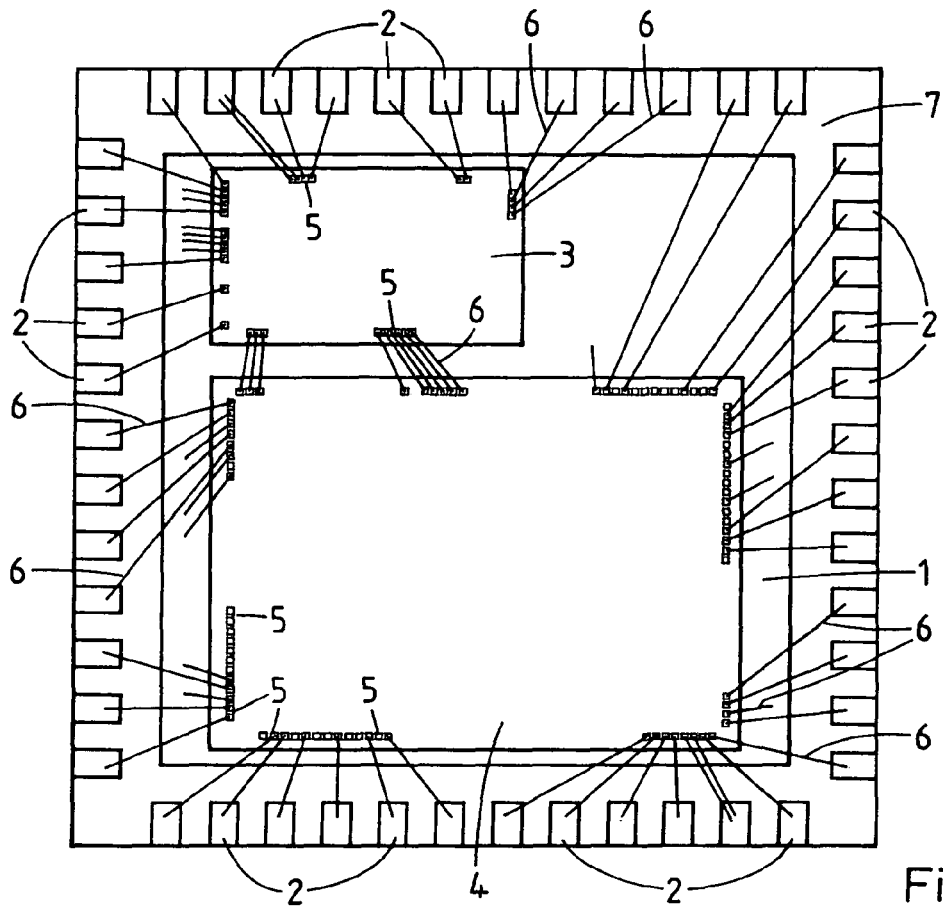
FIG. 1 schematically shows a top view of a GNSS receiver package according to the invention, FIG. 2 schematically shows a section of the GNSS receiver package of FIG. 1, FIG. 3 schematically shows a section of a GNSS receiver package according to another embodiment of the invention.
Figure 2:
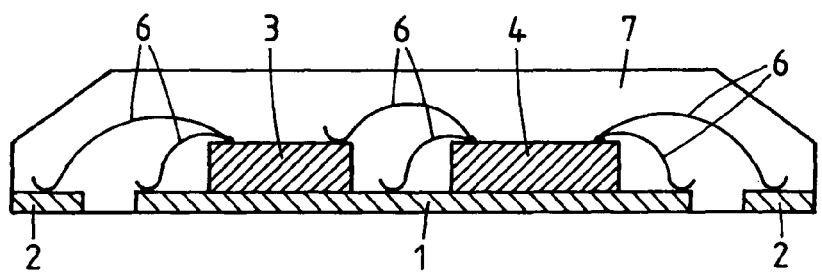

The GNSS receiver package according to a first embodiment of the invention (FIGS. 1, 2) comprises a support with a single connection layer comprising a rectangular plate 1 and pins 2 each consisting of an electrically conductive material, usually essentially copper. The pins 2 are, at a distance from the same, distributed along the sides of the plate 1. Plate 1 supports two bare dies, an analog die 3 and a digital die 4 which are attached to an upper side of the same by an adhesive. Analog die 3 and digital die 4 each have on their surfaces a plurality of pads 5 each of which can be electrically conductively connected to some other pad, to one of the pins 2 or to the plate 1. The connections are in each case established by bond wires 6, usually thin gold or aluminium wires.

The upper side of the support, i.e., of plate 1 and pins 2 is completely covered by a plastic mold 7 which encapsulates the analog die 3 and the digital die 4 together with the various bond wires 6 and holds plate 1 and pins 2 in place. The undersides of plate 1 and pins 2 are bare so they can contact pads or tracks when the package is attached to a printed circuit board. Plate 1 is usually connected to ground and serves for grounding several of the pads 5 which are connected to it by bond wires 6. Various types of packages which conform in a general way to the package as described are well known in the art as QFN, MLF and VQFN packages.

Packages can be assembled starting from a carrier, e.g., a plastic film, with an array of supports attached, fixing analog die 3 and digital die 4 on plate 1 of. each support, attaching the bond wires 6 and forming the mold 7 by applying a liquid plastic mass and curing it. Finally, the carrier is removed whereby the undersides of plate 1 and pins 2 are laid bare and the packages are separated by sawing.

Figure 3:
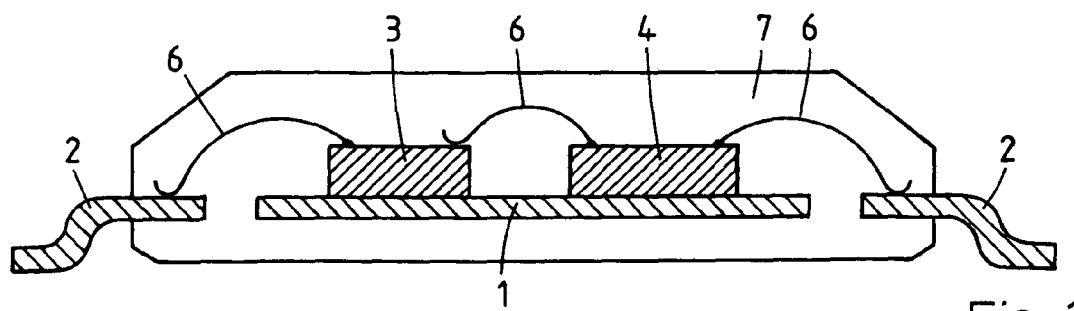

A slightly different embodiment is shown in FIG. 3. Here the mold encapsulates the support completely, apart from bent-down outer parts of the pins 2. Plate 1 is usually not directly accessible but it can be connected to one of the pins 2 by a bond wire for grounding. Packages of this type are known in the art as QFP, TQFP, SOP and TSOP packages.

Figure 4:
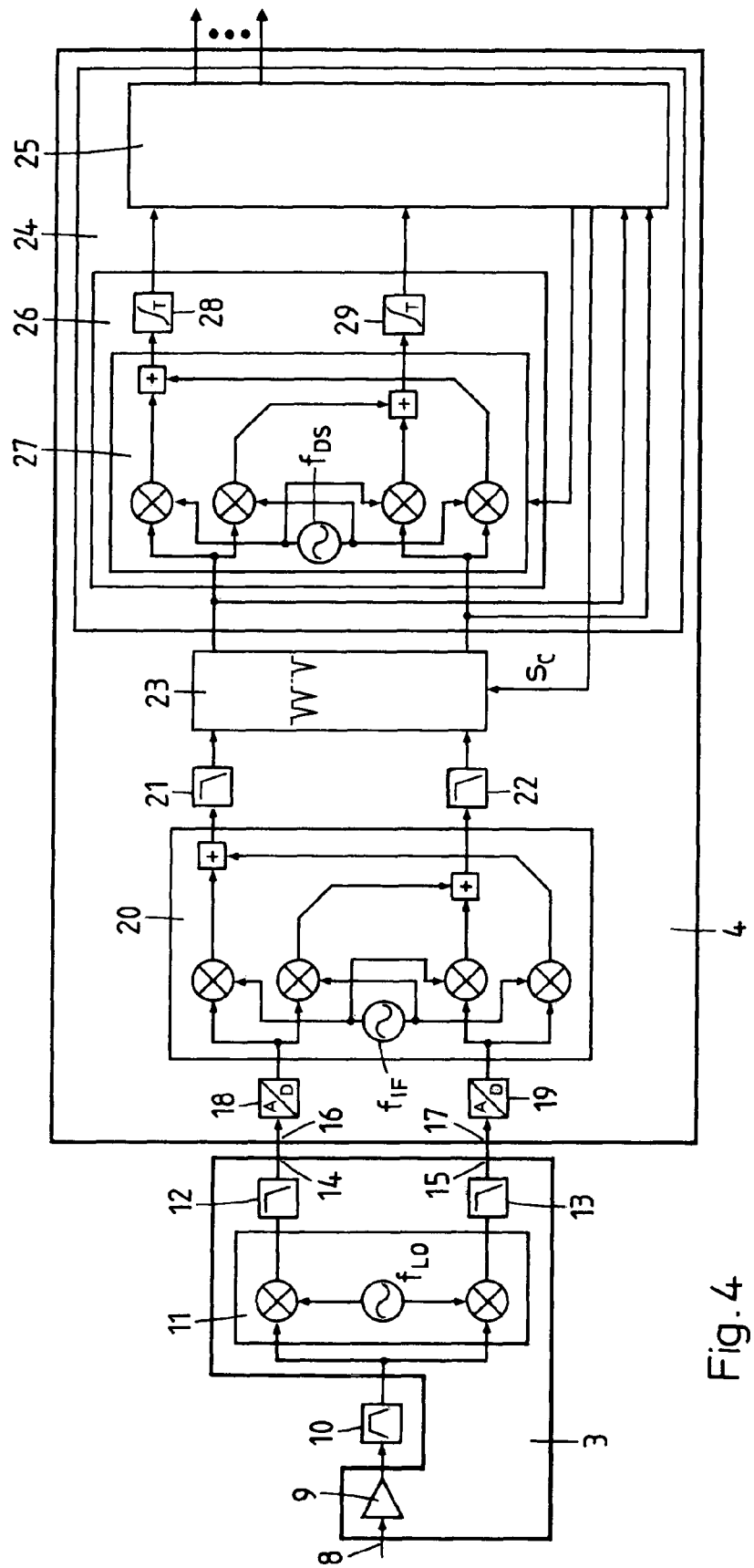
FIG. 4 shows a block diagram of the GNSS receiver package according to the invention.

As can be seen from FIG. 4, analog die 3 has an analog signal input 8 embodied by at least one of the pads 5 which is normally connected to an antenna via one of the pins 2. Analog signal input 8 is connected, via a low noise amplifier 9, to band pass filter 10 centered at the frequency of the satellite signal carrier and further, to the input of a complex mixer 11 which, by mixing it with a signal produced by a local oscillator, downconverts the analog input signal by a frequency $f_{LO}$ and produces a complex analog output signal centered at an intermediate frequency $f_{IF}$ of 3 MHz. The band pass filter 10 can be a component of the GNSS receiver package supported by the plate beside the analog die and the digital die 4 in which case it is electrically connected to the analog die 3 via pads 5 of the same and bond wires 6 or it can be a component external to the package in which case the electrical connections further involve pins 2 and tracks of a printed circuit board carrying the package and the band pass filter 10. The two components of the complex analog output signals are, via low pass filters 12; 13 or band pass filters, led to signal outputs 14, 15. Each of the signal outputs 14, 15 is connected to one of the signal inputs 16; 17 of the digital die 4.

Signal outputs 14, 15 and signal inputs 16, 17 are each embodied by pairs of pads 5 on analog die 3 and digital die 4, respectively, where each of the pads 5 on the first is directly connected to one of the pads 5 on the second by a bond wire 6.

Each of the signal inputs 16, 17 on the digital die 4 is connected to an analog-to-digital converter 18; 19 with a sampling rate of 24 MHz followed by a fully complex digital mixer 20 for downconverting the digital signal to a base band signal $s_{BB}$ whose frequency is close to zero. Each of the two signal paths for the complex signal leads via a low pass filter 21; 22 and a notch filter 23 to a digital processing unit 24, i.e., an evaluation unit 25 contained in the same and comprising an acquisition circuit and a tracking circuit which may be of conventional design and produce digital output signals which are led to pads 5 on the digital die 4 which are connected to pins 2 by bond wires 6 and contain the navigation data, i.e., the position information extracted from the satellite signals.

The notch filter 23 is a digital multiple notch filter whose transfer function exhibits several, e.g., up to eight suppression notches, i.e., narrow bands at specific spectral positions where its input signal is strongly suppressed, its magnitude being decreased by between 35 and 40 dB at the center frequency of the notch. The positions of the notches are adjustable and controlled by a control signal $s_C$ produced by the evaluation unit 25 based on the output of a scanning unit 26 which is also part of the digital processing unit 24.

The scanning unit 26 comprises a fully complex digital mixer 27 followed by an integrator 28; 29 for each output signal. The mixer frequency cyclically varies over a scanning interval of frequencies covering the normal frequency range of the output signal of low pass filters 21, 22, assuming a variety of scanning freqencies $f_{DS}$ which are, e.g., equidistant. In the evaluation unit 25, a magnitude value reflecting a time average of the power of the signal at the momentary scanning frequency is determined, e.g., by squaring the output values of integrators 28, 29 and adding the terms up, and compared with a threshold. If a strong jamming signal is present at a certain jamming frequency within the interval in question, mixing with a scanning frequency which is close to the negative of the jamming frequency will produce a magnitude value which is larger than the threshold. The control signal $s_C$ then causes the notch filter 23 to produce a suppression notch centered at the jamming frequency in order to suppress the nearby jamming signal.

Suppression of jamming signals by the notch filter 23 is independent of the origin of the signal. It may be contained in the analog input signal or it may be an internally generated signal of the GNSS receiver package or of some other component of the apparatus containing the same. Such interferences, picked up, e.g., by bond wires 6 connecting signal output pads 5 of the analog die 3 with signal input pads 5 of the digital die 4 will be effectively suppressed and will therefore not compromise the function of the GNSS receiver package, in particular its digital die 4.

An auxiliary factor in the suppression of internally generated jamming signals is the fact that the intermediate frequency is, at 3 MHz, lower than the clock rate of the digital die 4 at 12 MHz and far removed from it. Coupling of a jamming signal produced by the digital die 4 at the clock frequency or a multiple of the same into the signal path will therefore have practically no consequences.

There are, of course, many possible embodiments of the invention which deviate from the above. The package may, e.g., comprise additional dies and there may be several plates arranged side by side, each carrying a die or several dies.

LIST OF REFERENCE SYMBOLS 1 plate
2 pin
3 analog die
4 digital die
5 pad
6 bond wire
7 plastic mold
8 analog signal input
9 low noise amplifier
10 band pass filter
11 complex analog mixer
12, 13 low pass filters
14, 15 signal outputs
16, 17 signal inputs
18, 19 analog-to-digital converters
20 complex digital mixer
21, 22 low pass filters
23 notch filter
24 digital processing unit
25 evaluation unit
26 scanning unit
27 complex digital mixer
28, 29 integrators

The invention claimed is:

1. A GNSS receiver package with a plurality of bare dies, comprising:
    an analog die for converting an analog input signal to a complex analog output signal centered at an intermediate frequency, the analog die including:
        at least one analog signal input;
        at least two signal outputs;
        a complex analog mixer; and
        a pair of low pass filters, each low pass filter connected to at least one of the signal outputs;
    a digital die for deriving from the complex analog output signal a plurality of digital output signals, the digital die including:
        a number of signal inputs corresponding to the number of signal outputs of the analog die, each of the signal inputs connected to one of the signal outputs of the analog die;
        analog-to-digital converters for converting the complex analog output signal of the analog die to a complex digital signal, the analog-to-digital converters being connected to the signal inputs;
        a complex digital mixer and a notch filter, that follow the analog-to-digital converters, for suppressing jamming signals concentrated at at least one narrow frequency band; and
        a digital processing unit, that follows the complex digital mixer and the notch filter, for analyzing the signal by isolating and processing GNSS signals emitted by individual GNSS satellites, the digital processing unit being connected to several signal outputs for outputting the digital output signals;
    a support having a plate, the plate having electrically conductive material and having an upper side that carries the plurality of dies;
    pins arranged at a distance along a boundary of the plate for electrically connecting the package to outside components, the analog input of the analog die and the signal outputs of the digital die each being electrically connected to at least one of the pins, the electrical connections of any one of the plurality of dies being established by at least one bond wire connecting a pad on the die either to some other pad, or to one of the pins, or to the plate; and a plastic mold which covers at least the upper side of the plate, encapsulates the plurality of dies and the bond wires, and partially encapsulates each of the pins.

2. A GNSS receiver package according to claim 1, the notch filter being controllable by a control signal produced by the digital processing unit.

3. A GNSS receiver package according to claim 2, the transfer function of the notch filter exhibiting at least one suppression notch whose spectral position is adjustable.

4. A GNSS receiver package according to claim 2, wherein the intermediate frequency is lower than a clock rate of the digital die.

5. A GNSS receiver package according to claim 3, the digital processing unit comprising a complex digital mixer for downconverting a complex digital signal by different scanning frequencies distributed over a scanning interval, the notch filter being controllable in such a way that its transfer function exhibits suppression notches in spectral positions essentially coinciding with scanning frequencies where a magnitude value reflecting a time average of the power of the output signal of the complex digital mixer exceeds a threshold.

6. A GNSS receiver package according to claim 3, wherein the intermediate frequency is lower than a clock rate of the digital die.

7. A GNSS receiver package according to claim 5, wherein the intermediate frequency is lower than a clock rate of the digital die.

8. A GNSS receiver package according to claim 1, wherein the intermediate frequency is lower than a clock rate of the digital die.

\* \* \* \* \*